United States Patent

Lee

[15] 3,639,787

[45] Feb. 1, 1972

[54] INTEGRATED BUFFER CIRCUITS FOR COUPLING LOW-OUTPUT IMPEDANCE DRIVER TO HIGH-INPUT IMPEDANCE LOAD

[72] Inventor: Harry Charles Lee, West Lafayette, Ind.

[73] Assignee: RCA Corporation

[22] Filed: Sept. 15, 1969

[21] Appl. No.: 858,073

[52] U.S. Cl. ..........................307/303, 307/304, 317/235 G, 317/235 Y, 317/235 Z

[51] Int. Cl. .........................................................H01l 19/00

[58] Field of Search.......................317/235 G, 235 Y, 235 Z; 307/303, 304, 205, 221 C, 251, 279

[56] References Cited

UNITED STATES PATENTS

| | | | |
|---|---|---|---|
| 3,243,669 | 3/1966 | Sah | 317/234 |
| 3,427,445 | 2/1969 | Dailey | 307/205 X |
| 3,278,853 | 10/1966 | Lin | 317/235 |
| 3,283,170 | 11/1966 | Buie | 317/235 |
| 3,390,273 | 6/1968 | Weckler | 317/235 |
| 3,450,961 | 6/1969 | Tsai | 317/235 |
| 3,461,361 | 8/1969 | Delivorias | 317/235 |

*Primary Examiner*—John W. Huckert
*Assistant Examiner*—William D. Larkins
*Attorney*—H. Christoffersen

[57] ABSTRACT

The combination in a common substrate, of a lateral bipolar transistor operated in the common base mode and a field-effect transistor whose source (or drain) electrode is the collector electrode of said bipolar transistor. A signal applied to the emitter of the bipolar transistor causes a current to flow through the conduction channel of the field-effect transistor. The voltage thereby developed at the electrode common to both transistors, even in response to a small signal current, is of sufficient amplitude to drive a high-input impedance load such as other field-effect transistors embedded in the same substrate.

8 Claims, 5 Drawing Figures

INVENTOR.

Harry C. Lee

BY H. Christoffersen

ATTORNEY

INVENTOR.
Harry C. Lee
BY H. Christoffersen
ATTORNEY

INTEGRATED BUFFER CIRCUITS FOR COUPLING LOW-OUTPUT IMPEDANCE DRIVER TO HIGH-INPUT IMPEDANCE LOAD

BACKGROUND OF THE INVENTION

A characteristic of field-effect transistor (FET) circuits is their extremely high input impedance. Accordingly, the input signal to such a circuit, while it may be at a low-current level, must be at a relatively high voltage. On the other hand, bipolar circuits have low-input impedance and high-current, low-voltage output levels. Problems therefore arise when it is desired to have a bipolar circuit, or any circuit with comparable output impedance characteristics, drive a FET circuit.

One solution to the problem above is to employ a FET buffer circuit. However, such a circuit generally requires a multiplicity of components. This is undesirable especially in the integrated circuit technology because it means more expense in making the masks, lower yields and most importantly, chip area which more advantageously could be used for other circuits. Means also must be provided when employing a buffer circuit for preventing the buildup of excessive potential across the high impedance, low capacitance input circuit of the buffer. In addition to all of this, the buffer circuit introduces undesired time delay.

An object of the present invention is to provide a buffer circuit of the type discussed above but which is relatively simple and inexpensive, which requires little chip area, and which results in little time delay.

Another object of the present invention is to provide a buffer circuit which, in addition to its usual function, readily may be adapted to perform logic functions.

Another object of the invention is to provide an improved integrated circuit which includes, in a very small amount of chip area, transistors of different operating characteristics.

SUMMARY OF THE INVENTION

An integrated semiconductor circuit of special usefulness as a buffer. The circuit comprises a common substrate with at least two transistors formed therein. The first is a bipolar transistor which includes first and second electrodes of different conductivity than the region in which they are embedded. The second transistor is of the field-effect type and comprises said second electrode and a similar third electrode spaced from the second electrode and also embedded in the substrate, the substrate region between these two electrodes serving as a conduction channel. The conductivity of this channel is controlled by another electrode which is insulated from and electrically coupled to said channel.

BRIEF DESCRIPTION OF THE DRAWINGS

In the accompanying drawings like reference characters denote like components; and.

DETAILED DESCRIPTION OF THE INVENTION

Figure 1A:
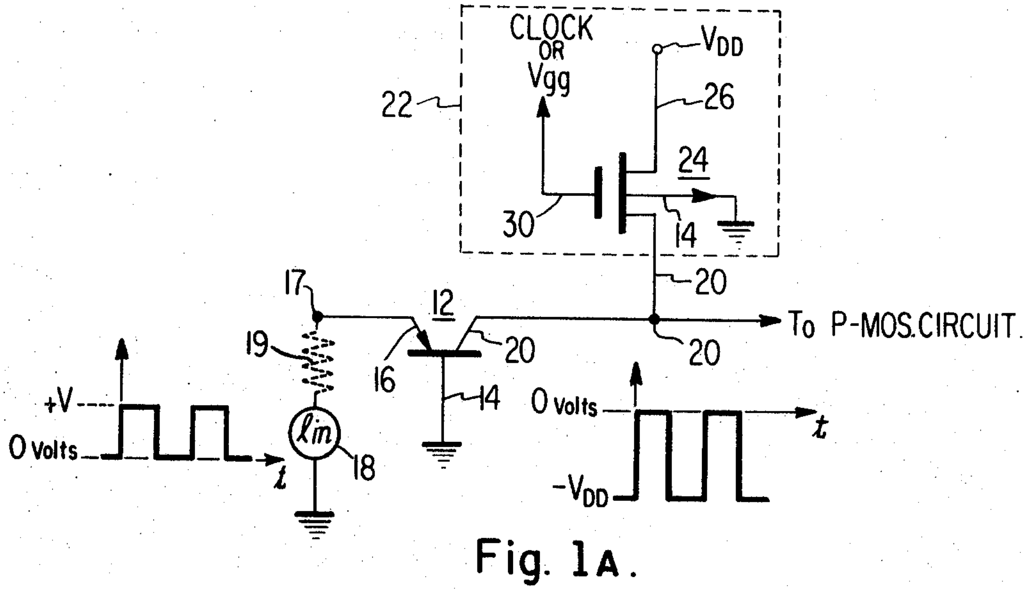
FIG. 1A is a schematic diagram of an embodiment of the invention.

The circuit of FIG. 1A shows a PNP bipolar transistor 12 having a base 14 connected to ground, an emitter 16 coupled to input point 17 and a collector 20. The input point 17 is connected via resistor 19 to a signal source 18. The source 18 may be any current source having a relatively low-voltage output and providing a positive signal, as shown. The resistor 19 shown in phantom view may not actually be present but represents the sum of the source impedance of the signal source and the base-to-emitter resistance of transistor 12. It is included in the circuit for purposes of the analysis given later.

Figure 1B:
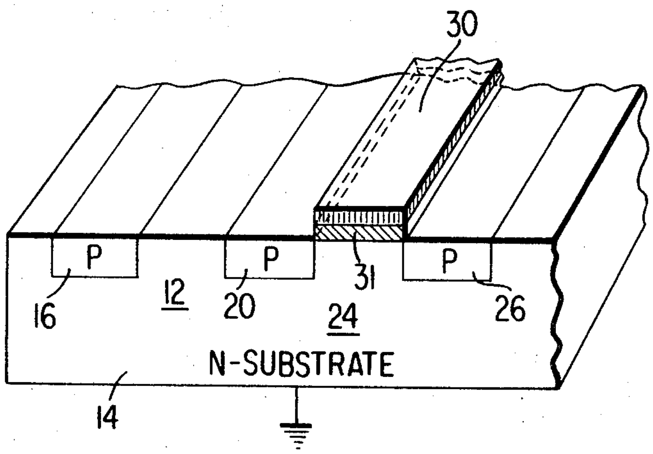
FIG. 1B is a cross-sectional view of a monolithic integrated circuit embodying the invention.

The collector 20 of transistor 12 is coupled to a load 22. Load 22 includes a P-conductivity type metal-oxide semiconductor (P-MOS) device 24 having its source region common with the collector 20 of transistor 12, a drain 26 connected to a source of $-V_{DD}$ potential and a gate electrode 30. The gate 30 is connected either to a source of direct current (DC) potential of amplitude $-V_{GG}$ or, as a means of minimizing power dissipation, to a clock signal whose maximum amplitude would be $-V_{GG}$. The substrate of transistor 24 is identical and common to the base of transistor 12 as shown in FIG. 1B and is connected to ground potential. P-MOS device 24 is a transistor which is operated as a resistor whose impedance is a function of the forward bias applied between the gate and source of the transistor. Through the value of the resistance is also dependent on the drain-to-source voltage, it may be assumed that the value of the resistance is primarily determined by the gate-to-source potential. Thus, the more negative $V_{GG}$ or the clock potential, the lower is the drain-to-source impedance of transistor 24.

FIG. 1B is a cross section of the circuit of FIG. 1A as it is manufactured in monolithic integrated circuit form. The identifying numbers in FIG. 1B are labeled to correspond to their functional description, shown in FIG. 1A. The N-type substrate 14 forms or functions as the chassis in which all the components are embedded by the diffusion therein of P-type regions.

Field-effect transistor 24 is formed by spaced-apart P-regions 20 and 26 which define the ends of a conduction channel. The space between the two P-regions (20 and 26)—the channel—is overlayed by an insulator layer 31, such as silicon dioxide ($SiO_2$), over which a metal electrode 30, which defines the gate electrode of the transistor, is placed.

In a P-MOS transistor, the source is defined as that electrode of the two conduction channel electrodes having the most positive potential applied thereto. Therefore in FIGS. 1A and 1B P-region 20 which will normally be at a positive potential with respect to P-region 26 is called the source. But it is to be kept in mind that an FET is a bidirectional device and therefore may conduct current in either direction. It is therefore clear that an electrode (20 or 26) defining an end of the conduction channel may be the source for one direction of conduction and the drain for the opposite direction of conduction.

FIG. 1B shows that PNP lateral bipolar transistor 12 is formed by spacing P-region 16 (the emitter of transistor 12) from the adjacent P-region 20 (the collector of transistor 12), by a narrow region of the N conductivity type substrate 14, the latter acting as the base of transistor 12. The FET transistor 24 manufactured on the same substrate consists of just two diffused regions, one of the two regions being a region (electrode 20) common to both transistors.

In the operation of the circuit, a signal source 18 generates pulses having a maximum amplitude of +V volts and a minimum value of ground potential, as shown in FIG. 1A. These pulses cause emitter current ($I_e$) to flow into the emitter-base region of transistor 12. The current $I_e$ equals approximately the amplitude of the signal ($+V$) minus the emitter-to-base drop of transistor 12 ($V_{eb}$) divided by the resistance 19 which includes the source impedance of signal source 18 and the input resistance of transistor 12. $[I_e=(+V-V_{eb})/R_9]$. The values of $+V$, $V_{eb}$ and $R_{19}$ could typically be, respectively, 5.4 volts, 0.6 volts and 2,000 ohms giving an $I_e$ of 2.4 milliamps. The emitter current $I_e$ causes a collector current $I_c$ to flow which is related to $I_e$ by the common base forward current transfer ratio ($\alpha$). That is, $I_c$ is equal to $\alpha I_e$.

Transistor 12 is known as a lateral transistor and its $\alpha$ is generally low. However, even if $\alpha$ is 0.5 (which is an extremely and improbably low number) the output voltage ($V_c$) at the collector 20 will be driven close to 0 volts whenever transistor 12 is made to conduct. $V_c$ is equal to $-V_{DD}$ plus $\alpha I_e$ multiplied by the drain-to-source resistance ($R_{DS}$) of transistor 24 [$V_c$ $x - V_{DD} + \alpha I_e \times R_{DS}$]. Assuming, by way of example, that $R_{DS}$ is 10 K. ohms and that $-V_{DD}$ equals −12 volts, a maximum $\alpha I_e = I_c$ of 1.2 milliamps will be sufficient to drive $V_c$ between 0 volts and $-V_{DD}$ volts. However, since the input impedance of P-MOS circuits (not shown) which are connected to the collector 20 of transistor 12 is of the order of $10^{14}$ ohms, there is no reason why $R_{DS}$ cannot be made much larger than 10 K. ohms. Thus, for example if $R_{DS}$ is made equal to 1 megohm ($10^6$ ohms), an $I_c$ of 0.012 milliamps would be sufficient to drive the collector of transistor 12 between $-V_{DD}$ and 0 volts.

The current generated by the signal source thus flows into the emitter of transistor 12 and causes a collector current to flow. The collector current flows into an extremely high impedance thereby providing high voltage gain.

The low-output voltage of the signal source which may be either a current generator or a voltage source having a high-source impedance is thus converted into a large voltage swing. Thus, standard bipolar logic circuits such as diode-transistor logic (DTL) or transistor-transistor logic (TTL) can be directly coupled to the interface circuit of the invention. Also, linear circuits operated at relatively low supply levels and with low-voltage outputs can now be directly coupled to the FET chip.

A further advantage of the proposed circuit is that it presents an extremely low-input impedance to the external world while being compatible with very high impedances at its output. Thus, while providing the benefits of impedance transformation, the circuit of the invention provides protection for the FET circuit by presenting the buildup of excessive voltages across the input terminals. Since the voltage across the input can never go very high, this circuit eliminates the need for protective circuits which have to be connected across the inputs of FET circuits.

Figure 2A:
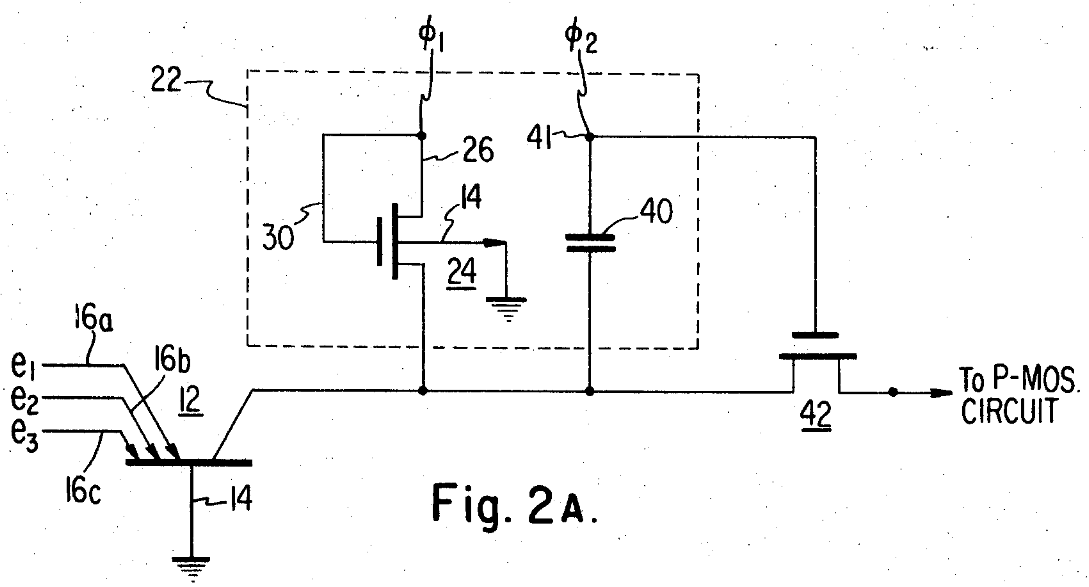
FIG. 2A is a schematic diagram of another embodiment of the invention showing how it may be used as a logic gate.

In the circuit of FIG. 2A the level converter is connected as a logic gate whose input is compatible with various bipolar logic circuits and whose output is compatible with the voltage levels present on the array. Transistor 12 is now shown having a multiplicity of emitters which for ease of illustration is limited to three emitters 16*a*, 16*b* and 16*c*. Each emitter is coupled to a different source of signal denoted respectively $e_1$, $e_2$ and $e_3$. The load 22 network shown in FIG. 2A contains a transistor 24 which is identical to that shown in FIG. 1A, but now transistor 24 has its gate and drain connected together and coupled to a clock signal $\phi 1$.

Load 22 also includes a capacitor 40 having one end connected in common with collector-source region 20 and the other end connected to a terminal 41 to which a clock signal denoted by $\phi 2$ is applied.

The output signal generated at the collector-source region 20 is coupled to the rest of the integrated circuit by gating transistor 42 whose gate is also coupled to $\phi 2$.

Figure 2B:
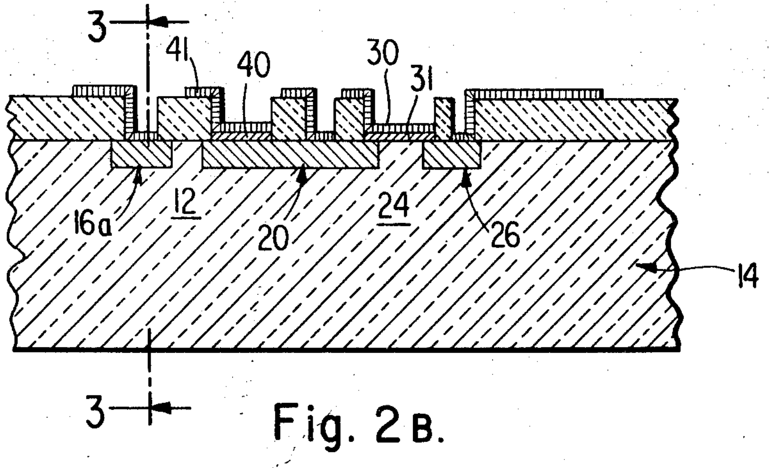
FIG. 2B is a cross-sectional view of part of the integrated circuit of FIG. 2A.

The circuit of FIG. 2A (with transistor 42 omitted) is shown in integrated form in FIG. 2B. Bipolar transistor 12, as in FIG. 1, has an emitter region 16, a collector region 20 and a base region which is part of substrate 14. FET transistor 24 also uses regions 20 as one of its source and drain electrodes and region 26 as the other one of its source and drain electrodes. The capacitor 40 is formed by depositing a thin insulator layer over part of collector-source region 20 and depositing a metallic electrode 41 over this region. Capacitor 40 is thus formed having one end common to the collector of bipolar device 12 and the other to a metallic electrode to which a signal may be applied.

Figure 3:
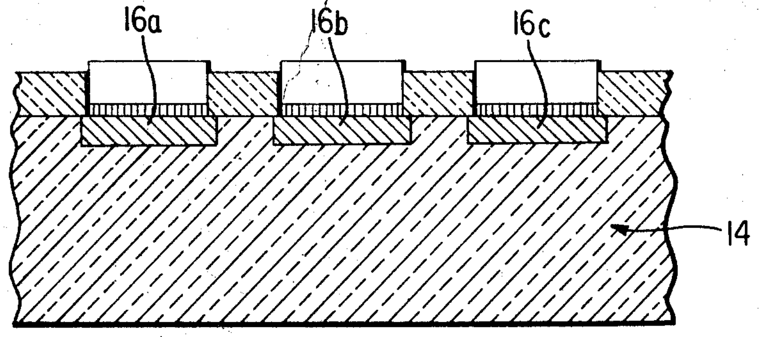
FIG. 3 is a partial cross-sectional view of FIG. 2A taken along line 3—3.

FIG. 3 shows in cross-sectional view, taken along the line 3—3 of FIG. 2B, the structure of the multiple emitters.

The $\phi 1$ clock signal functions to precharge the collector-source region 20. The clocks, $\phi 1$ and $\phi 2$ vary from 0 volts to, let us assume, a negative potential of $-V_1$ volts which is larger than $-V_{DD}$ volts. When $\phi 1$ goes to $-V_1$ the potential at collector-source 20 goes to approximately $-V_1$ volts, if and only if the input voltage applied to emitters 16*a*, 16*b* and 16*c* is equal to or less than 0 volts. Note that the threshold voltage ($V_T$) of transistor 24 prevents the potential at collector-source 20 from going more negative than $-[V_1 - V_T]$ when only $\phi_1$ is applied. If, a positive voltage is applied to any one of the emitter leads, the collector source 20 is clamped to ground potential. Thus, when $\phi 1$ makes an excursion from 0 to $-V_1$ volts if all the inputs are grounded then the capacitance associated with collector-source 20 is precharged to approximately $-V_1$ volts. If, on the other hand, one or all of the input signals are positive, the capacitance associated with the collector-source region 20 will be discharged and the potential at 20 substantially equal to 0 volts.

Gating transistor 42 is enabled during $\phi 2$ time (i.e., only so long as $\phi 2$ is at $-V_1$ volts.) The purpose of $\phi^2$ and capacitor 40 is to enhance the signal level and to provide a time slot for readout which occurs when $\phi 2$ goes to $-V_1$ volts. Thus, when $\phi 2$ goes from 0 to $-V_1$ volts it opens transmission gate 42 and transmits the signal at collector 20 to other circuits on the P-MOS array.

The role of $\phi 2$ and capacitor 40 is best appreciated by examining the circuit operation. If the potential at collector-source 20 is 0 volts, is (AC) coupled by means of capacitor 40 to P-region 20. If either $e_1$, $e_2$ or $e_3$ is high ($+V$) transistor 12 is conducting and collector-source 20 is at approximately 0 volts. $\phi 2$ when first applied causes a sharp negative spike which is quickly discharged to ground potential.

If, on the other hand, $e_1$, $e_2$ and $e_3$ are low (0 volts) the collector-source region is already charged to a negative potential by $\phi 1$, the application of $\phi 2$ causes more negative charge to flows across the reverse PN junction (P-region 20 and N substrate 14) capacitance. The potential at collector-source 20 is thus made even more negative than $-V_1$. When transmission gate 42 is enabled a larger voltage than $-V_1$ is coupled to the next stage thereby obviating any problem that might arise due to the threshold voltage offset of transistor 24 which limits the potential at collector-source 20 to a threshold voltage drop above $-V_1$. The use of capacitor 40 and $\phi 2$ thus ensures the generation of well-defined, large amplitude signals for transmission to the system. The operation of the circuit as a logic gate is best understood by first defining the voltage levels in logic equivalent. Thus, for the positive logic levels (the inputs to transistor 12) ground potential is logic "0" and a positive voltage $+V$ is logic "1"; and for the negative logic levels (the output of transistor 12 and remainder of chip) ground potential is logic "0" and a negative voltage ($-V_1$) is logic "1."

Based on the previous discussion the output ($V_c$) at collector-source 20 is $-V_1$ (or more) volts—logic "1"—when the input signals $e_1 = e_2 = e_3 = 0$ volts—logic "0."

The output $V_c$ may thus be expressed as $V_c = \overline{e_1 + e_2 + e_3}$. This is the classical expression of a NOR output and transistor 12 with its multiple emitters thus functions as a "NOR" gate.

It should be noted that using the logic definitions above stated and using but one emitter electrode as in FIG. 1A that the circuit of the invention operates as an (logic) inverter.

The fabrication of the lateral transistor shown in FIGS. 1A, 1B and as shown in FIG. 2 with multiple emitters does not require any extra steps in the present P-MOS process.

Capacitor 40 shown in FIG. 2 is also easily fabricated by depositing an insulating layer over a part of region 20 and by putting a metal electrode (41) over the insulator. The addition of $\phi 1$ and $\phi 2$ which serve to precharge the collector region and to read out the information at the collector at a given time enable the impedance of transistor 24 to be made in what is called the ratioless form. That is, since $\phi 1$ precharges collector-source 20 and $\phi 2$ enhances the potential at the collector the ratio of the impedance of transistor 24 may be optimized for a system consideration such as speed of operation and is not limited to an impedance ratio which is required for the conduction or nonconduction of the next stage. The ratioless feature of the load in combination with the lateral PNP inverter function enables extremely fast operation. With this type of converter, it is feasible to decode DTL or TTL outputs at rates determined by the DTL and TTL logic circuits. The circuit of the invention with multiple emitter electrodes is thus ideally suited for memory decoding, multiplex decoding or other high speed positive voltage logic to P-MOS array level converters.

Though the circuits have been shown using a substrate of N-conductivity type with diffused P-regions it should be obvious that the conductivity types could be reversed. Also, though the devices shown are insulated-gate field-effect devices it should be clear that the invention is also applicable to any of the known types of field-effect devices.

What is claimed is:

1. An integrated semiconductor circuit comprising, in combination:

a substrate of first conductivity type;

a bipolar transistor comprising first and second regions of second conductivity type spaced apart along a surface of said substrate and extending into said substrate for forming the collector and emitter regions of said bipolar transistor;

a field-effect transistor comprising a third region of said second conductivity type extending into said substrate spaced apart from said second region, said second and third regions forming source and drain electrodes of, and the region of the substrate between them forming the conduction channel of, said field-effect transistor, an insulating layer lying on the surface of said conduction channel, and a metallic electrode on said insulating layer for controlling the conductivity of said channel; output means coupled to said second region;

means for applying a first potential to said first region; and means for applying a second potential to said metallic electrode in a direction to forward bias said field-effect transistor.

2. The combination as claimed in claim 1 further including means for applying ground potential to said substrate.

3. The combination as claimed in claim 1 wherein one of said first and second conductivity type is P-type semiconductor material and the other one of said first and second conductivity type is N-type semiconductor material.

4. The combination comprising:

a substrate of first conductivity type; first, second and third distinct regions of second conductivity type spaced apart along a surface of said substrate and extending into said substrate;

a lateral bipolar transistor operated in the common base mode whose base is common to said substrate, said transistor having at least one emitter electrode for the application thereto of input signals and a collector region, said emitter comprising said first region and said collector region comprising said second region;

a field-effect transistor output means coupled to said second region having source and drain regions defining the ends of a conduction path and a control electrode, wherein one of said source and drain regions is said collector region and the other one of said source and drain regions is said third region; and means for applying a potential to said control electrode in a direction to forward bias said field effect transistor 5. The combination comprising:

a substrate of given conductivity type;

a first lateral bipolar transistor operated in the common base mode whose base is common to said substrate, said transistor having a plurality of emitter electrodes for the application thereto of input signals and a collector region;

a field-effect transistor embedded in said substrate having source and drain regions defining the ends of a conduction path and a control electrode, wherein one of said source and drain regions is said collector region; and output means coupled to said collector region.

6. The combination as claimed in claim 5, further including a plurality of input signals, each signal being applied to a different one of said emitter electrodes, and wherein in response to the presence of said signals a current is generated in said bipolar transistor which flows through said source-drain conduction path.

7. The combination as claimed in claim 5, further including a capacitor having two electrodes, one electrode being common to said collector region.

8. The combination as claimed in claim 7, further including first and second sources of clock signals, wherein said first source is coupled to the gate electrode of said field-effect transistor and wherein said second source is coupled to the other electrode of said capacitor.

* * * * *

UNITED STATES PATENT OFFICE
CERTIFICATE OF CORRECTION

Patent No. 3,639,787 Dated February 1, 1972

Inventor(s) Harry Charles Lee

It is certified that error appears in the above-identified patent and that said Letters Patent are hereby corrected as shown below:

| | | |
|---|---|---|
| Column 2 | line 16 | change "Through" to ---Though---. |
| | line 65 | change "$V_{eb})/R_9$" to ---$V_{eb})/R_{19}$---. |
| Column 3 | line 1 | change "X" to --- = ---. |
| | line 57 | change "regions" to ---region---. |
| Column 4 | line 20 | after "volts", insert ---the clock signal, $\phi 2$, which goes from 0 to $-V_1$ volts,---. |
| Column 6 | after line 7 | insert ---output means coupled to said second region---. |
| | line 8 second | delete "output means coupled to said second region". |

Signed and sealed this 29th day of August 1972.

(SEAL)
Attest;

EDWARD M. FLETCHER, JR.
Attesting Officer

ROBERT GOTTSCHALK
Commissioner of Patents

Disclaimer 3,639,787.—*Harry Charles Lee*, West Lafayette, Ind. INTEGRATED BUFFER CIRCUITS FOR COUPLING LOW OUTPUT IMPEDANCE DRIVE TO HIGH INPUT IMPEDANCE LOAD. Patent dated Feb. 1, 1972. Disclaimer filed June 8, 1972, by the assignee, *RCA Corporation*.

Hereby enters this disclaimer to claims 1 through 4 of said patent.

[*Official Gazette November 6, 1973.*]